United States Patent [19]
Hall

[11] Patent Number: 5,963,086
[45] Date of Patent: Oct. 5, 1999

[54] CLASS D AMPLIFIER WITH SWITCHING CONTROL

[75] Inventor: David S. Hall, San Jose, Calif.

[73] Assignee: Velodyne Acoustics, Inc., San Jose, Calif.

[21] Appl. No.: 08/908,907

[22] Filed: Aug. 8, 1997

[51] Int. Cl.[6] .............................. H03F 3/38; H03F 21/00; H03F 3/217
[52] U.S. Cl. ........................ 330/10; 330/207 A; 330/251
[58] Field of Search .................................. 330/10, 207 A, 330/251

[56] References Cited

U.S. PATENT DOCUMENTS

| | | |
|---|---|---|
| Re. 33,333 | 9/1990 | Taylor, Jr. et al. . |
| 3,294,981 | 12/1966 | Bose . |
| 3,579,132 | 5/1971 | Ross . |
| 3,899,745 | 8/1975 | Fletcher et al. . |
| 4,015,213 | 3/1977 | Hamada . |
| 4,056,786 | 11/1977 | Morrison et al. . |
| 4,059,807 | 11/1977 | Hamada . |
| 4,162,455 | 7/1979 | Birt . |
| 4,346,349 | 8/1982 | Yokoyama . |
| 4,390,813 | 6/1983 | Stanley . |
| 4,439,738 | 3/1984 | Atherton . |
| 4,456,872 | 6/1984 | Froeschle . |
| 4,724,396 | 2/1988 | Taylor, Jr. et al. . |
| 4,743,860 | 5/1988 | Dziagwa ................................. 330/251 |
| 4,884,183 | 11/1989 | Sable . |
| 4,910,416 | 3/1990 | Salcone ................................. 330/251 |
| 4,992,749 | 2/1991 | Tokumo et al. . |
| 4,992,751 | 2/1991 | Attwood et al. . |
| 5,014,016 | 5/1991 | Anderson . |
| 5,077,539 | 12/1991 | Howatt . |
| 5,117,198 | 5/1992 | Morenz . |
| 5,160,896 | 11/1992 | McCorkle et al. . |
| 5,306,986 | 4/1994 | Siao . |
| 5,345,165 | 9/1994 | Froeschle . |
| 5,371,666 | 12/1994 | Miller . |
| 5,479,337 | 12/1995 | Voigt . |
| 5,594,386 | 1/1997 | Dhuyvetter . |
| 5,617,058 | 4/1997 | Adrian et al. . |

Primary Examiner—Robert Pascal
Assistant Examiner—Patricia Nguyen
Attorney, Agent, or Firm—Theodore J. Bielen, Jr.

[57] ABSTRACT

A class D amplifier utilizing first and second switches connected in series to conduct current from a power source in a sequential manner. The switches have a common output node between them. A pulse width modulator is utilized to produce first and second signals identified as the high and low side. The first switch connects to a drive which receives the first signal from the pulse width modulator to close the first switch. A second switch drive receives a second signal from the pulse width modulator to operate the second switch in a sequential manner. A toggle or commutator device utilizes third and fourth switches in series with an inductor. The toggle device is connected to the common node between the first and second switches in order to closely control the switching of the first and second switches to eliminate loss of energy associated with the rapid switching normally found in a class D amplifier.

19 Claims, 4 Drawing Sheets

CLASS D AMPLIFIER WITH SWITCHING CONTROL

BACKGROUND OF THE INVENTION

The present invention relates to a novel class D amplifier with a switching control circuit.

In theory, class D amplifiers constitute a highly efficient power source for use in audio and illumination systems. Class D amplifiers normally include a pair of solid state switches sequentially driven by a transformer to produce a square-wave output.

Unfortunately, switching of such solid state devices are subject to loss of efficiency due to on-stage resistance, inherent capacitances, and the like. In addition, "shoot-through" currents place high electrical stress on the switch components and increase the amount of electromagnetic interference generation in the system.

Many variations have been proposed to class D or pulse width modulated amplifiers to solve such problems.

U.S. Pat. No. 3,294,981 describes a signal translation which converts an input level into two signals, each of a certain rate, retaining the characteristic of an input signal. The translation is intended to faithfully reproduce low level input signals for audio use.

U.S. Pat. Nos. 3,579,132 and 3,899,745 describe class D amplifiers which provide for decreased distortion by use of filters and transformer-coupled output circuits.

U.S. Pat. No. 4,015,213 shows a pulse width modulated signal amplifier which provides a proportion between the pulse width modulator signal and an input signal.

U.S. Pat. No. 4,056,786 teaches a low level class D amplifier in which all of the stored energy recovered during the nonconducting portion of the amplifier circuit is returned to the DC power supply.

U.S. Pat. No. 4,456,872 shows a current controlled two state modulation system which maintains a constant voltage output with use by a limiting amplifier.

U.S. Pat. No. 4,059,807 describes a pulse width modulated amplifier in which a pulse modulated signal is fed to a pulse amplifier and a low-pass filter. The output of a low pass filter is coupled back to a mixer which also receives an audio signal input.

U.S. Pat. No. 4,162,455 shows an amplifier system in which a pair of class D amplifiers are used together and which includes separate clock pulse trains to cancel switching frequency ripple at the common output of the two amplifiers.

U.S. Pat. No. 4,346,349 shows a class D amplifying circuit which enhances the power efficiency of a multi channel audio power amplifier. The carrier frequency of the class D amplifier is set at a low value to eliminate spurious radiation of the carrier signal.

U.S. Pat. No. 4,390,813 concerns a transformer for driving class D amplifiers which are to be used in the lighting field. Use of the class D amplifier is claimed to reduce power consumption.

U.S. Pat. No. 4,439,738 describes a class D pulse width modulated amplifier which includes circuitry for short circuiting turns on the output transformer to protect the amplifier against transients returning from the load.

U.S. Pat. No. Re. 33,333 teaches; an audio amplifier with a modulator for transforming an analog audio input signal into two complementary trains of pulse width modulated signals to drive the power switches. Certain pulses are dropped and compensated for by a distortion detection system.

U.S. Pat. No. 4,724,396 shows a digital audio amplifier for converting the onset of a clipping condition into a missed pulse in a pulse train generated from an analog signal by pulse width modulator. The analog input signal is attenuated and responsive to a voltage as a result of the clipping.

U.S. Pat. No. 4,884,183 shows a pulse width modulated control signal for use in a motor control which includes a variable frequency discontinuous mode controller and a hysteretic continuous mode controller for transition between modes.

U.S. Pat. No. 4,992,749 teaches a pulse width modulating amplifier circuit with a pair of bootstrap circuits for increasing the power voltage during periods of shortage.

U.S. Pat. No. 4,992,751 presents a digitally controlled amplifier circuit for use with an audio amplifier having phase modulated pulse width modulation. The output is used with a filter to smooth the pulse width modulated signal to and control the polarity of the switching circuit.

U.S. Pat. No. 5,014,016 utilizes a high efficiency amplifier circuit having first and second modulator circuits. The outputs of the two modulators circuits are coupled to a push-pull output bridge. This output is coupled to the load.

U.S. Pat. No. 5,077,539 describes a switching amplifier system in which the switching circuitry is responsive to a tri-state command signal.

U.S. Pat. No. 5,160,896 teaches a class D amplifier which adds a hystersis voltage source to limit the current flow to the conducting paths in the amplifier.

U.S. Pat. No. 5,117,198 teaches a MOSFET device for use in a class D amplifier. A pair of inductors are used with a diode combined with the MOSFETS to improve the life of the MOSFETS in the amplifier.

U.S. Pat. No. 5,306,986 shows a high efficiency class D amplifier in which the output is connected to the common node between switching transistors. In this way stray capacitance of the transistors is transferred to the inductance before switching.

U.S. Pat. No. 5,345,165 shows a two-state modulation system in which a hysteretic comparator receives a hystersis control signal to vary the threshold of the comparator.

U.S. Pat. No. 5,371,666 describes a current mode control apparatus using a pulse width modulator to reduce gate drive signals for driving the power output section.

U.S. Pat. No. 5,479,337 teaches a high efficiency analog power amplifier utilizing a pulse width modulation signal to operate switching devices coupled in series across a D.C. power source. Zero voltage level is impressed on each transistor through a resonant circuit to enable switching of the transistors.

U.S. Pat. No. 5,594,386 describes a class D pulse width modulator amplifier which has a current switch, a integrator, and a comparator connected in a feedback loop. United loop generates an ultrasonic frequency carrier which is employed to modulate a audio input signal.

U.S. Pat. No. 5,617,058 shows a digital switching amplifier where linearization of the power switches is accomplished by using three states.

A class D amplifier which solves the problems encountered in the field would be a notable advance in the electronics art.

SUMMARY OF THE INVENTION

In accordance with the present invention a novel and useful class D amplifier is herein provided.

The amplifier of the present invention utilizes first and second switches which are connected in series to conduct current from a power source in a sequential manner. This "push-pull" arrangement is typical of a class D amplifier of the prior art. In essence, the first and second switches may be solid states switches such as transistors, MOSFETS, and the like. The output of the switches derives from a power source, and is normally a square wave found in a common node between the switches. The output common node is normally connected to a low pass filter before passing to a load such as an audio speaker. The switches are typically driven by a pulse width modulator which produce first and second signals, noted as the "high and low signals". That is to say, the signals from the pulse width modulator drive the first and second switches either to the positive side of the power source or to the negative side of the power source, as the case may be.

In this regard, first and second switch drives are employed to close the first and second switches sequentially, since the first and second switch drives are active one at a time.

The invention also comprises active toggling means or a switch control device. The switch control device utilizes a third switch, a fourth switch, and an inductor in series. The third and fourth switches and the inductor are also connected in series to the common node between the first and second switches. The third and fourth switches may also be MOSFETS. In this regard, the first, second, third, and fourth switches may comprise MOSFETS each having an inherent clamping diode.

Further, the amplifier of the present invention may additionally include means for more effectively capturing residual current from the third and fourth switches during their operation. This captured current is returned to the power source of the present invention. Moreover, means is also found in the present invention for selectively reducing the switching speed of the first and second switches. A capacitor may be attached to the common node between the first and second switches to perform this function.

The first and second switches are further controlled by turn-on delay means which selectively prevents the closing of the first and second switches for a predetermined time period after receipt of the first and second signals from the drives; associated with the pulse width modulator. Such delay means may take the form of AND gates used in conjunction with a comparator. Such turn-on delay means allows the inductor of the toggle device to store current between the change of states occurring during the switching cycles of the first and second switches. The turn-on delay may also take the form of an external timing control in the form of a computer or similar device.

Moreover, the amplifier of the present invention also possesses means for returning power captured by the inductor in the toggle switch to the power supply. Such function is achieved by a catch resistor and transformer, which are located adjacent, or formed as part of the inductor of the toggle switch.

It may be apparent a novel and useful class D amplifier of extremely high efficiency has been described.

It is therefore an object of the present invention to provide an amplifier in which the output is controlled and changed in an orderly manner without the need to provide components that operate at rapid speed.

Another object of the present invention is to provide an amplifier which eliminates "shoot-through" currents which place extremely high electrical stresses on the switch components and produce electromagnetic interference.

A further object of the present invention is to provide a class D amplifier in which all of the energy normally lost in the switching of a conventional class D amplifier is captured and recycled back into the power supply.

Yet another object of the present invention is to provide a novel class D amplifier in which heat generation is substantially reduced during its operation.

Another object of the present invention is to provide a class D amplifier which is amenable to miniaturization and, thus, is useful in audio systems, computers, and any other devices where minimal heat generation and minimal electromagnetic interference generation is a criteria.

Another object of the present invention is to provide a class D amplifier which may be employed with 110 or 220 volts of power supply without alteration.

Another object of the present invention is to provide a class D amplifier which possesses a high degree of reliability due to control of the switching of the solid state components.

The invention possesses other objects and advantages especially as concerns particular characteristics and features thereof which will become apparent as the specification continues.

For a better understanding of the invention references made to the following detailed description of the preferred embodiments thereof which should be taken in conjunction with the prior described drawings.

DETAILED DESCRIPTION OF THE PREFERRED EMBODIMENTS

Various aspects of the present invention will evolve from the following detailed description of the preferred embodiments thereof which should be taken in conjunction with the prior described drawings.

Figure 1:
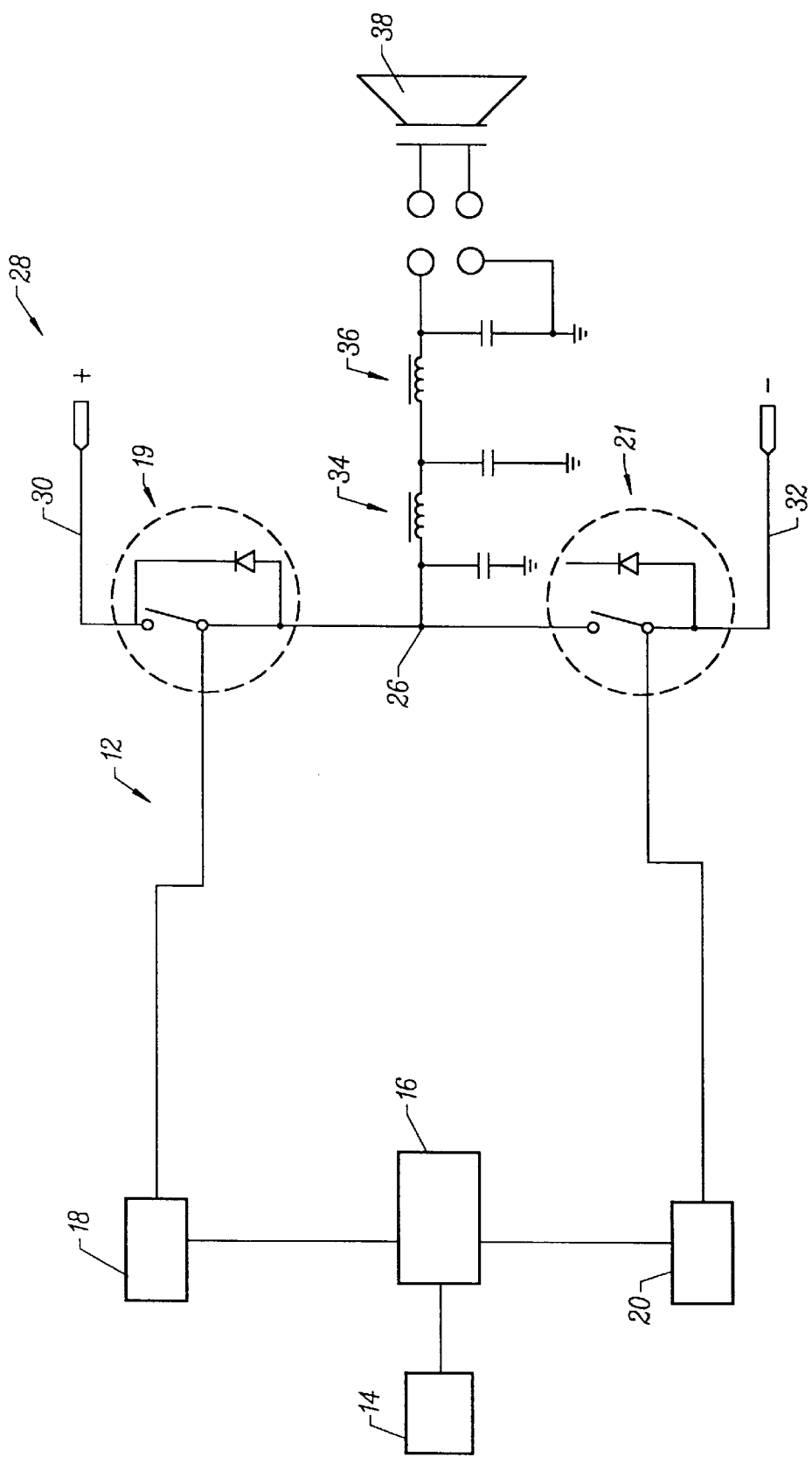
FIG. 1 is a schematic view of a prior art class D amplifier.

With reference to FIG. 1, a prior art conventional class D amplifier system 12 is generally shown. A pre-amplifier 14 sends a signal, which may be an audio signal, to control logic 16. Control logic 16 is normally a pulse width modulator formed typically with a negative feedback from the output in the amplifier 12. For example, control logic 16 is shown by the McCorkle reference U.S. Pat. No. 5,160,896, FIG. 1. The McCorkle reference is incorporated herewith in its entirety in this regard. Moreover, control logic 16 may take the form of a pulse width modulator found in the HIP4080EVAL2 manufactured by Harris Conductor, Melbourne, Fla. Control logic 16 generates a two phase signal to high side drive 18 and to low side drive 20. High side and low side drives 18 and 20 may take the form of an IR 2113 drive component. Drives 18 and 20 operate sequentially to close switches 19 and 21. In other words, switches 19 and 21 operate 180° out of phase with each other and produce an output: at node 26 by conducting current from power source 28 indicated by power rails 30 and 32. Power source 28 may be 110 volts or 220 volts. The power from node 26 passes through output inductor 34 and low pass filter 36 to load 38, which is illustrated in FIG. 1 as an audio speaker, although other electronic devices such as computers may be employed with amplifier 12.

In the conventional amplifier 12 illustrated in FIG. 1, power switching conducts current to node 26 and output inductor 34 such that such current will naturally fly back to the opposite power rail when one of the switches opens. That is to say, if switch 19 opens, current in inductor 34 will naturally fly back to power rail 32. Although this is accomplished with very little loss of power a problem occurs when inductor 34 is discharging. Output node 26 tends to remain in a discharging state when switching reverses between push-pull switches 19 and 21. In other words, the newly closed switch must forcibly change the state of the system of amplifier 12. Such opposite switching must begin conduction to a higher current than that being discharged from inductor 34. The inherent diode in any of the switches 19 and 21 conducting the discharging current goes through a reverse recovery delay. Once this occurs, the output node 26 will change state. Large losses occur in this process as the opposite switch, either switch 19 or 21, must conduct large amounts of current dropping across power supply 28. In addition, the inherent diodes found in switches 19 and 21 have longer reverse recovery times as larger voltages are used with the amplifier 12 shown in FIG. 1. Moreover, residual capacitance exists in switches 19 and 21 which resists the switching from rail 30 to rail 32.

Moreover, under a small signal condition, amplifier 12 runs at a very low loss condition. However, as a signal increases from control logic 16, the amplifier 12 eventually converts to a continuous mode of operation, alternating between the first and second states through the alternate switching of switches 19 and 21. High losses occur when such switching takes place.

Although it is possible to reduce the value of inductor 34 in amplifier 12 to the size the region of a low signal condition, increase current flow will occur during every cycle creating higher losses in the switching devices 19 and 21. Also, high peak currents occur in this mode so that the losses in the circuit due to heat ($I^2R$) are much higher than otherwise would be.

Generally, there is an inherent conflict between high efficiency and rapid switching and electromagnetic interference, due to "shoot-through" currents and rapid voltage changes at the input of conductor 34, in prior art amplifier 12.

Figure 2:
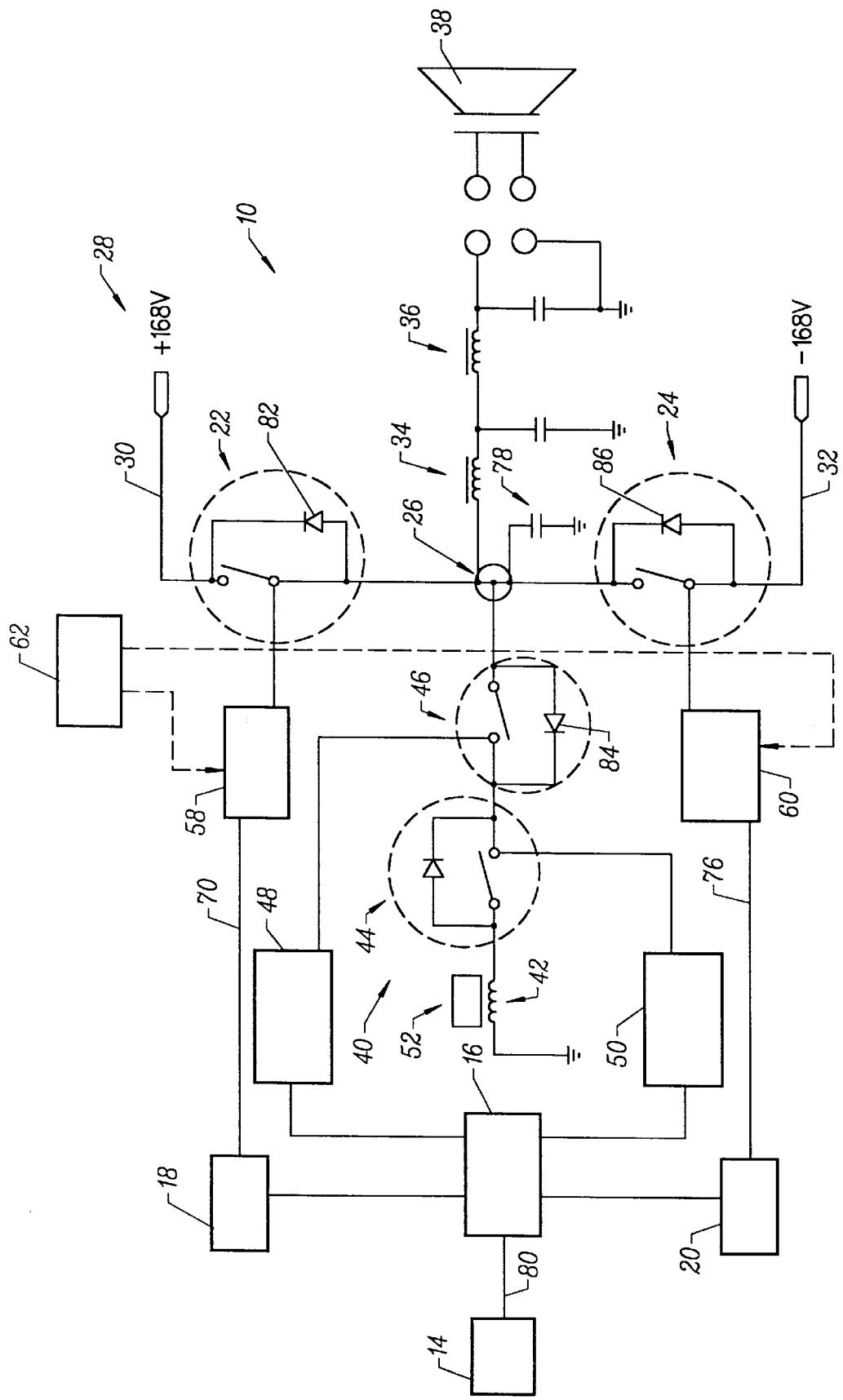
FIG. 2 is a schematic view drawing of the class D amplifier system of the present invention.
Figure 5:
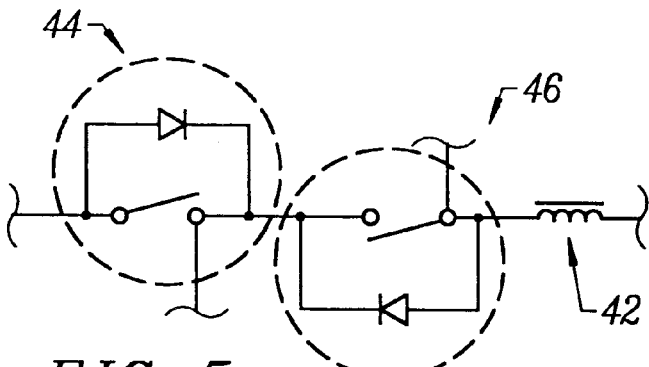
FIG. 5 is a schematic view of a possible series connection of the toggling device of the present invention.
Figure 6:
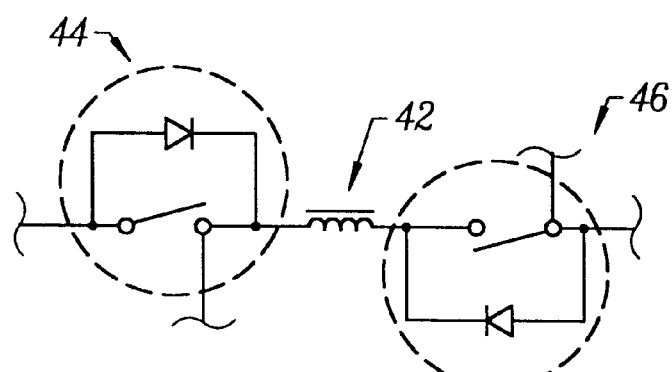
FIG. 6 is a schematic view of another possible series connection of the components of the toggling device of the present invention.
Figure 7:
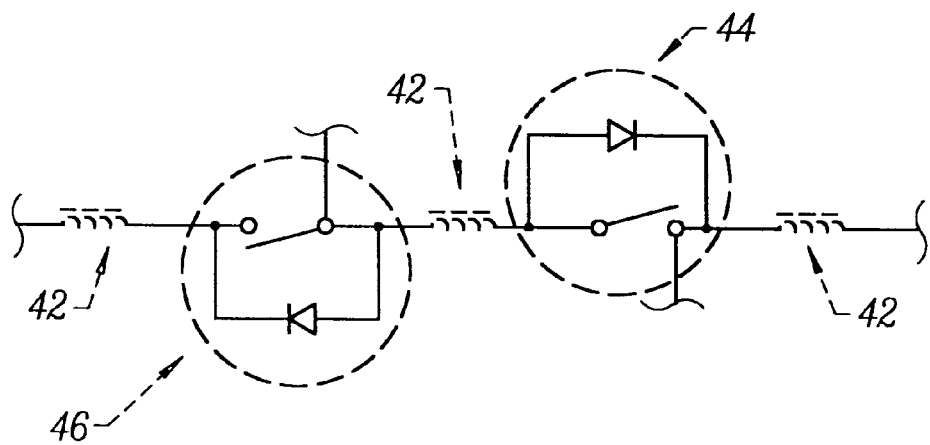
FIG. 7 is a schematic view representing yet another possibility of the series connection of the components of the toggling device of the present invention.

Turning now to FIG. 2, it may be observed that the amplifier 10 of the present invention is depicted. Amplifier 10 includes many common components of the prior art of the class D amplifier 12, and such components are noted by common reference characters. It should be observed, that active toggling or switching control device 40 is depicted in FIG. 2, and includes as its elements, third and fourth switches 44 and 46 which may be in the form of MOSFETS, having inherent clamping diodes. Inductor 42, and switches 44 and 46 are connected in series and may be in any order. With reference to FIGS. 5–7, it may be observed that inductor 42 may lie outside of switch 46, between switches 44 and 46, or (FIG. 7) between or outside of switches 44 and 46 found in reverse order from that shown in FIGS. 5 and 6. Active toggling device 40 connects to common node 26 between switches 22 and 24. Toggling device serves to control the switching of switches 22 and 24 as will be described hereinafter.

Control logic 16, in one state, also sends a high side drive signal to high side drive 48, typically identified as IR2104, which in turn operates MOSFET switch 46. As a corollary, control logic 16 also send a low side drive signal to low side drive 50 which operates switch 44. Low side drive 50 is a generally identical component to high side drive 48.

Figure 4:
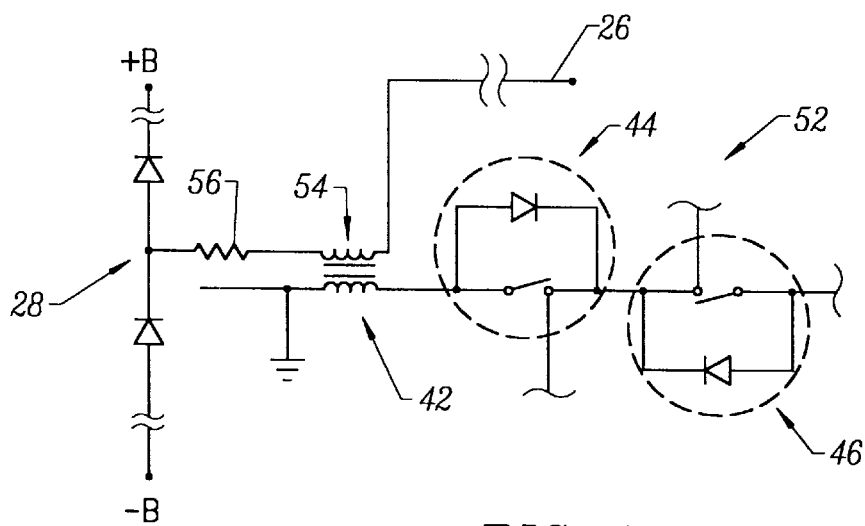
FIG. 4 is a schematic view of the catch inductor and resistor in the toggle switch portion of the invention shown in FIG. 2.

Amplifier 10 of the present invention also includes means 52 for capturing residual current from active toggling device 40. That is to say, switches 44 and 46 will, reverse recovery charge when control logic 16 changes the state of amplifier 10. Inductor 42 picks up residual current in this regard. With reference to FIG. 4, current capturing means 52 is shown in detail in which, alternatively, a resistor 52 or an inductor 54 may be used to dissipate or (placed in series for illustration) to catch residual current found at inductor 42 and return the same to power source 28, respectively.

Figure 3:
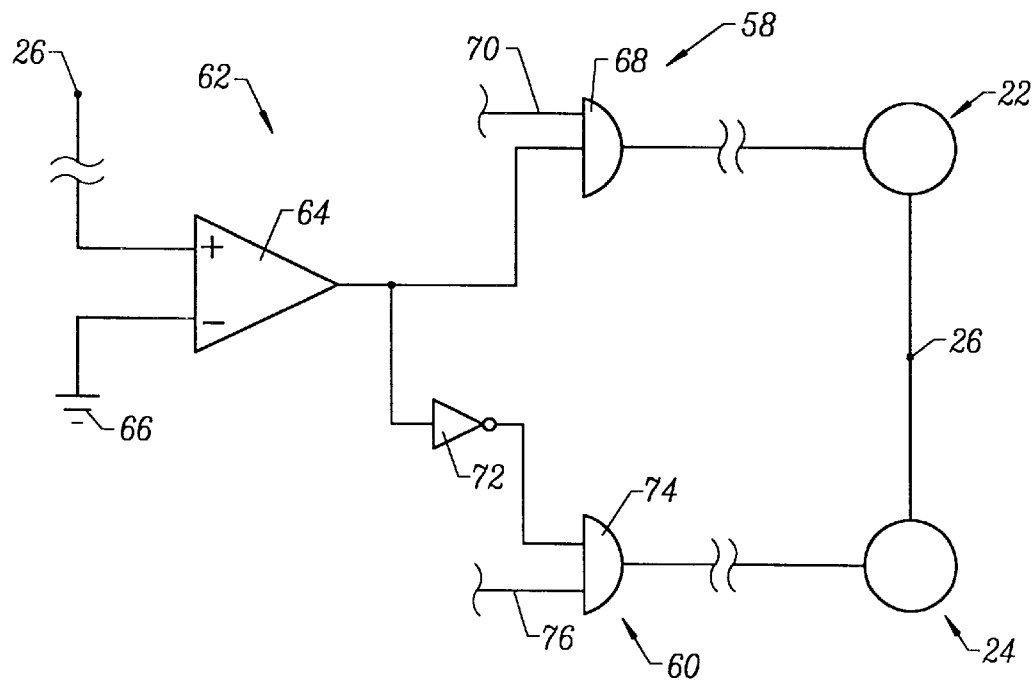
FIG. 3 is a schematic view of the turn-on delay portion of the class D amplifier system of FIG. 2.

During the sequential operation of switches 22 and 24, either switch begins conduction before inductor 42 has discharged excessive current through the clamping diode associated with each switch. In this regard, turn-on delays 58 and 60 are employed in the present invention and are regulated by high-low control 62, shown schematically in FIG. 2. Turning to FIG. 3, turn-on delays 58 and 60 and high-low control are more closely detailed. Comparator 64 receives positive voltage from output node 26 and negative voltage from ground 66. The output of comparator 64 is sent to an AND gate 68 which also receives signal leg 70 from high side drive 18. The output of comparator is also sent through inverter 72 to AND gate 74 which also receives a signal leg 76 from low side drive 20. The outputs of AND gates 68 and 74 are fed to switches 22 and 24 in sequential fashion.

Further control of the amplifier 10 is obtained by the use of capacitor 78 which is employed to slow down the switching speed of MOSFETS 22 and 24 at node 26. Capacitor 78 also reduces electromagnetic interference since capacitor 78 does not contribute to dissipation of current in amplifier 10.

The following table lists components typically used in amplifier 10:

| TABLE LIST OF COMPONENTS | | |
| --- | --- | --- |
| ITEM | MODEL/RATING | SOURCE |
| Control Logic 16 | HIP4080AEVAL2 | Harris Semiconductor Melbourne, Florida |
| High Side Drive 18 | IR2113 | Internal Rectifier |

-continued

TABLE LIST OF COMPONENTS

| ITEM | MODEL/RATING | SOURCE |
| --- | --- | --- |
| | | El Segundo, California |
| High Side Drive 48 | IR2101 | |
| Low Side Drive 20 | IR2113 | |
| Low Side Drive 50 | IR2101 | |
| MOSFETS 22 & 24 | emtw16n40e | Motorola Corp. |
| | | Tempe, Arizona |
| MOSFETS 44 & 46 | emtw16n40e | |
| INDUCTOR 34 | 150 micro Henry | Velodyne Acoustics, Inc. |
| | CORE: MICROMETALS T184-2 | San Jose, California |
| | WINDING: 80 TURNS #15 WIRE | |
| INDUCTOR 42 | 7 micro Henry | |
| | CORE: MICROMETALS T80-2 | |
| | WINDING: 35T #20 WIRE | |
| | CATCH WINDING: 35T #30 WIRE | |
| | WOUND ON TOP OF 1ST WINDING | |
| CAPACITOR 78 | 100 picof | Motorola Corp. |
| | | Tempe, Arizona |
| RESISTOR 56 | 10 ohms, 2 watt | |
| INDUCTOR 54 | 7 micro Henry | |
| AND GATES 68 & 74 | 4001 | |
| COMPARATOR 64 | 40106 | |
| INVERTER 72 | 40106 | |

In operation, input device 14, which may be a pre-amplifier, feeds an input signal 80 to control logic 16. The pulse width modulating function of control logic 16 sends a two-phase signal to switch drivers 18 and 20 as well as toggling switch drivers 48 and 50. Assuming that the output at node 26 is in the positive, state switch 22 is turned on through turn on delay 58 such that inductor 34 is discharging through clamp diode 82 within switch 22. When control logic 16 changes state, switch 22 opens and active toggling device switch 44 closes. Inductor 42 now connects to the positive supply voltage from rail 30 conducting through diode 84 of switch 46. Inductor 42 increases its current according to the formula:

$$E = L * dI/dT$$

Thus, the current in inductor 42 slowly ramps up until such current exceeds the current flowing out of diode 82 of switch 22. The output at node 26, ideally a sinusoidal shape, now changes state. At this time, toggling inductor 42 possesses a surplus of current due to additional charging caused by diode 82 possessing a recovery charge. Inductor 42 discharges surplus current to the negative power supply and continues to conduct through diode 84 of switch 46 and diode 86 of switch 24. Switch 20 is open at this time. When inductor 42 ceases to discharge current, diode 84 will cease to conduct. Inductor 42 returns to a zero voltage state, ready for the next cycle. Since diode 84 has a reverse recovery charge, inductor 42 dissipates or picks up residual current therefrom and returns such current to power supply 28 by the use of capturing means 52, detailed in FIG. 4. When such change of state occurs, through control logic 16, switch 24 is turned on at the same time switch 44 of toggling device 40 is turned on. In reality, switch 24 begins conduction before inductor 42 has discharged excessive current through diode 86. Turn-on delays 58 and 60, regulated by high-low control 62, now comes into play, allowing inductor 42 to fully discharge during such change of state. Turn-on delays 62 and 60 are detailed in FIG. 3 and are, in the present embodiment, linked to the actual change of state dictated by control logic 16. However, turn-on delay means 60 and 62 may be timed as a function of the current flowing through amplifier 10 by the use of other devices such as a computer.

Capacitor 78 slows down the switching speed of switches 22 and 24 to reduce electromagnetic interference. Capacitor 78 does not contribute to current dissipation within amplifier 10. When switch 24 begins to open at the change of state emanating from control logic 16, capacitor 78 provides some limitation in addition to the inherent capacitance found within switch 24. It should be noted that such inherent capacitance is also found in the switch 22. Inductor 42 is not required when switch 22 begins to close again. Thus, the operation of switch 46 is immaterial at this point. Inductor 34 will fly back until diode 82 of switch 22 begins to conduct. Consequently, amplifier 10 has now progressed through a complete cycle.

While in the foregoing, embodiments of the present invention have been set forth in considerable detail for the purposes of making a complete disclosure of the invention, it may be apparent to those of skill in the art that numerous changes may be made in such detail without departing from the spirit and principles of the invention.

What is claimed is:

1. An amplifier utilizing first and second switches connected in series to conduct current from a power source in a sequential manner, and having a common output node therebetween, comprising;
   a. a pulse width modulator producing first and second signals;
   b. a first switch drive receiving said first signal from said pulse width modulator to close said first switch;
   c. a second switch drive receiving said second signal from said pulse width modulator, to operate said second switch, only one of said first and second switch drives being active at one time;
   d. an active toggling device comprising, a third switch, a fourth switch, and an inductor, said third switch said fourth switch, and said inductor being connected in series to each other and to the common output node between said first and second switches.

2. The amplifier of claim 1 which additionally comprises means for selectively capturing residual current from said third and fourth switches.

3. The amplifier of claim 1 which additionally comprises delay means for selectively preventing the closing of said first and second switches for a predetermined time period by said first and second signals, respectively.

4. The amplifier of claim 3 which additionally comprises means for selectively capturing residual current from said third and fourth switches.

5. The amplifier of claim 1 which additionally comprises means for reducing the switching speed of said first or second switches.

6. The amplifier of claim 5 in which said means for reducing the switching speed of said first or second switches comprises a capacitor connected to the common node between the first and second switches.

7. The amplifier of claim 5 which additionally comprises means for capturing residual current from said third or fourth switches.

8. The amplifier of claim 7 which additionally comprises delay means for preventing the closing of said first or second switches for a predetermined time period by said first and second signals, respectively.

9. The amplifier of claim 1 which additionally comprises a third switch drive receiving said first signal from said pulse width modulator to close said third switch and a fourth switch drive receiving said second signal from said pulse width modulator to close said fourth switch.

10. The amplifier of claim 1 in which said first, second, third, and fourth switches are MOSFETS.

11. The amplifier of claim 10 in which said MOSFET switches each include an inherent clamp diode.

12. The amplifier of claim 1 which additionally comprises means for capturing residual current from said induction of said active toggling device.

13. An amplifier utilizing first and second switches connected in series to conduct current from a power source in a sequential manner, and having a common output node therebetween,
   comprising;
   a. a pulse width modulator producing first and second signals;
   b. a first switch drive receiving said first signal from said pulse width modulator to close said first switch;
   c. a second switch drive receiving said second signal from said pulse width modulator, to operate said second switch, only one of said first and second switch drives being active at one time; and
   d. an active toggling device comprising switch means to control the switching of said first and second switches, said switch means being connected the common output node between said first and second switches, said active toggling device including at least a third switch connected to said common output node between said first and second switches.

14. An amplifier utilizing first and second switches connected in series to conduct current from a power source in a sequential manner, and having a common output node therebetween,
   comprising;
   a. a pulse width modulator producing first and second signals;
   b. a first switch drive receiving said first signal from said pulse width modulator to close said first switch;
   c. a second switch drive receiving said second signal from said pulse width modulator, to operate said second switch, only one of said first and second switch drives being active at one time;
   d. an active toggling device comprising switch means to control the switching of said first and second switches, said switch means being connected the common output node between said first and second switches; and
   e. means for selectively capturing residual current from said switch means.

15. An amplifier utilizing first and second switches connected in series to conduct current from a power source in a sequential manner, and having a common output node therebetween,
   comprising;
   a. a pulse width modulator producing first and second signals;
   b. a first switch drive receiving said first signal from said pulse width modulator to close said first switch;
   c. a second switch drive receiving said second signal from said pulse width modulator, to operate said second switch, only one of said first and second switch drives being active at one time;
   d. an active toggling device comprising switch means to control the switching of said first and second switches, said switch means being connected the common output node between said first and second switches;
   e. delay means for selectively preventing the closing of said first and second switches for a predetermined time period by said first and second signals, respectively; and
   f. means for reducing the switching speed of said first or second switches.

16. An amplifier utilizing first and second switches connected in series to conduct current from a power source in a sequential manner, and having a common output node therebetween,
   comprising;
   a. a pulse width modulator producing first and second signals;
   b. a first switch drive receiving said first signal from said pulse width modulator to close said first switch;
   c. a second switch drive receiving said second signal from said pulse width modulator, to operate said second switch, only one of said first and second switch drives being active at one time;
   d. an active toggling device comprising switch means to control the switching of said first and second switches, said switch means being connected the common output node between said first and second switches; and
   e. means for reducing the switching speed of said first or second switches.

17. The amplifier of claim 16 in which said means for reducing the switching speed of said first or second switches comprises a capacitor connected to the common output node between the first and second switch.

18. An amplifier utilizing first and second switches connected in series to conduct current from a power source in a sequential manner, and having a common output node therebetween,
   comprising;
   a. a pulse width modulator producing first and second signals;
   b. a first switch drive receiving said first signal from said pulse width modulator to close said first switch;
   c. a second switch drive receiving said second signal from said pulse width modulator, to operate said second switch, only one of said first and second switch drives being active at one time; and
   d. an active toggling device comprising switch means to control the switching of said first and second switches, said switch means being connected the common output node between said first and second switches, said first and second switches and said switch means comprising MOSFETS.

19. The amplifier of claim 18 in which said MOSFETS switches each include an inherent clamp diode.

* * * * *